United States Patent
Cramer et al.

(10) Patent No.: US 8,390,823 B2
(45) Date of Patent: Mar. 5, 2013

(54) METHOD, INSPECTION APPARATUS AND SUBSTRATE FOR DETERMINING AN APPROXIMATE STRUCTURE OF AN OBJECT ON A SUBSTRATE

(75) Inventors: Hugo Augustinus Joseph Cramer, Eindhoven (NL); Henricus Johannes Lambertus Megens, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 251 days.

(21) Appl. No.: 12/884,107

(22) Filed: Sep. 16, 2010

(65) Prior Publication Data

US 2011/0085176 A1 Apr. 14, 2011

Related U.S. Application Data

(60) Provisional application No. 61/250,834, filed on Oct. 12, 2009.

(51) Int. Cl.
G01B 11/24 (2006.01)
(52) U.S. Cl. ............... 356/601; 356/237.4; 356/445; 430/30; 355/67
(58) Field of Classification Search .... 356/237.1–237.5, 356/445–448, 601–623, 399–401; 430/30; 355/67
See application file for complete search history.

(56) References Cited

U.S. PATENT DOCUMENTS

| 7,522,293 B2 | 4/2009 | Wu et al. |
| 2005/0185174 A1 | 8/2005 | Laan et al. |
| 2007/0222979 A1 * | 9/2007 | Van Der Laan et al. ... 356/243.1 |
| 2007/0229854 A1 | 10/2007 | Wu et al. |
| 2008/0049226 A1 | 2/2008 | Mieher et al. |
| 2008/0069430 A1 | 3/2008 | Setija et al. |
| 2008/0117434 A1 | 5/2008 | Verstappen et al. |

FOREIGN PATENT DOCUMENTS

EP 1 628 184 A1 2/2006

OTHER PUBLICATIONS

International Search Report with the Written Opinion of the International Searching Authority directed to related International Application No. PCT/EP2010/063378, mailed on Dec. 8, 2010, European Patent Office, Rijswijk, Netherlands; 12 pages.

* cited by examiner

*Primary Examiner* — Hoa Pham
(74) *Attorney, Agent, or Firm* — Sterne, Kessler, Goldstein & Fox P.L.L.C.

(57) ABSTRACT

A system and method determine an approximate structure of an object on a substrate. This may be applied in model based metrology of microscopic structures to assess critical dimension or overlay performance of a lithographic apparatus. A scatterometer is used to determine approximate structure of an object, such as a grating on a stack, on a substrate. The wafer substrate has an upper layer and an underlying layer. The substrate has a first scatterometry target region, including the grating on a stack object. The grating on a stack is made up of the upper and underlying layers. The upper layer is patterned with a periodic grating. The substrate further has a neighboring second scatterometry target region, where the upper layer is absent. The second region has just the unpatterned underlying layers.

13 Claims, 6 Drawing Sheets

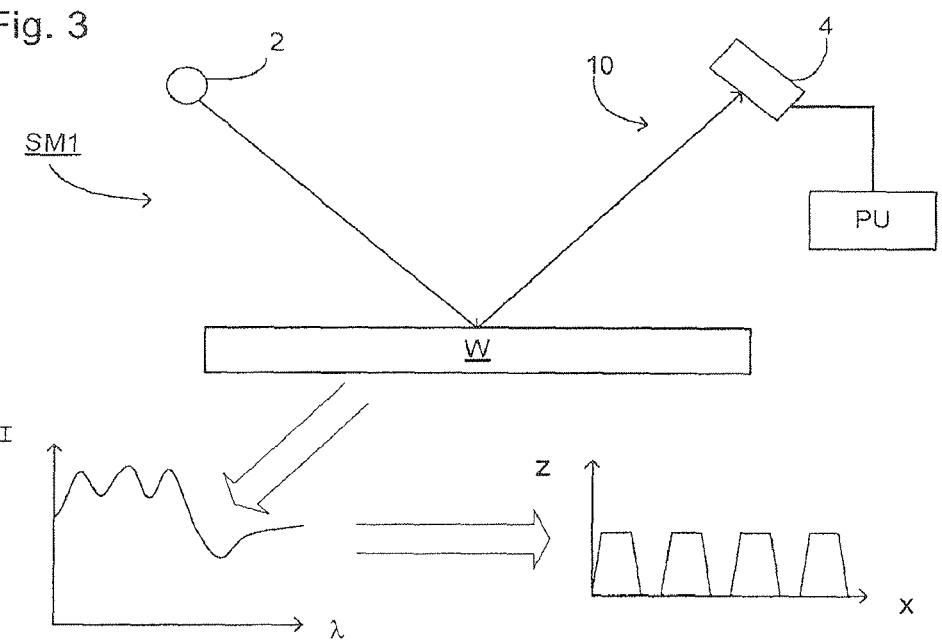
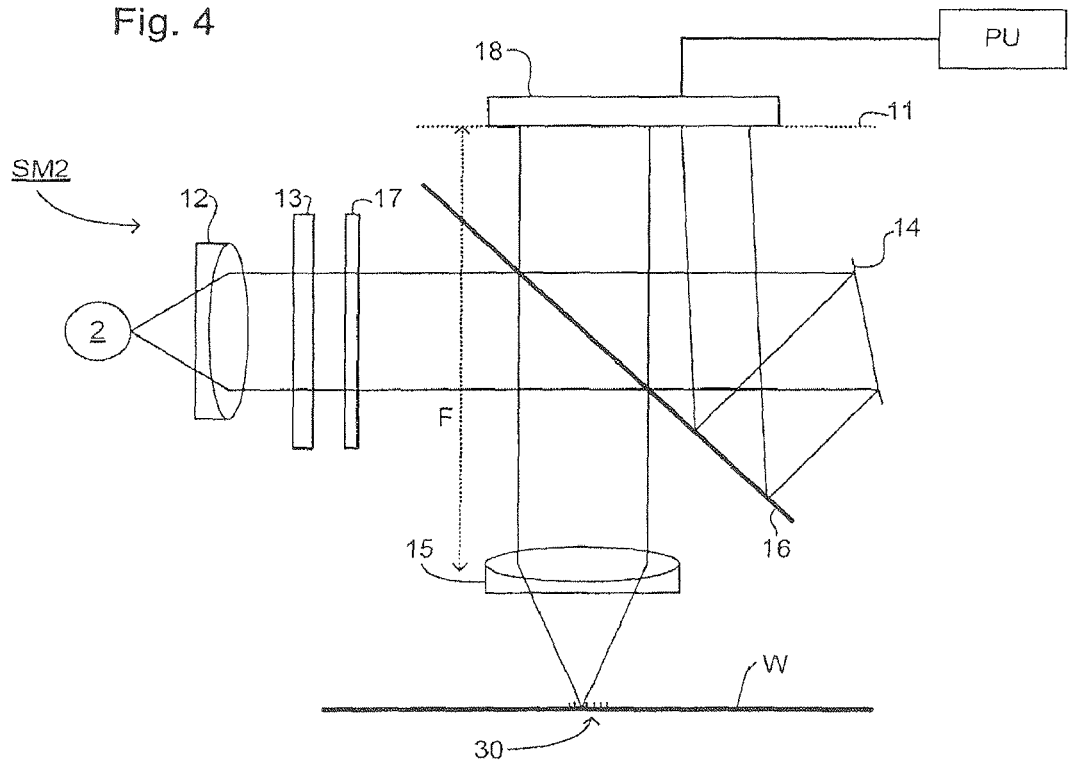

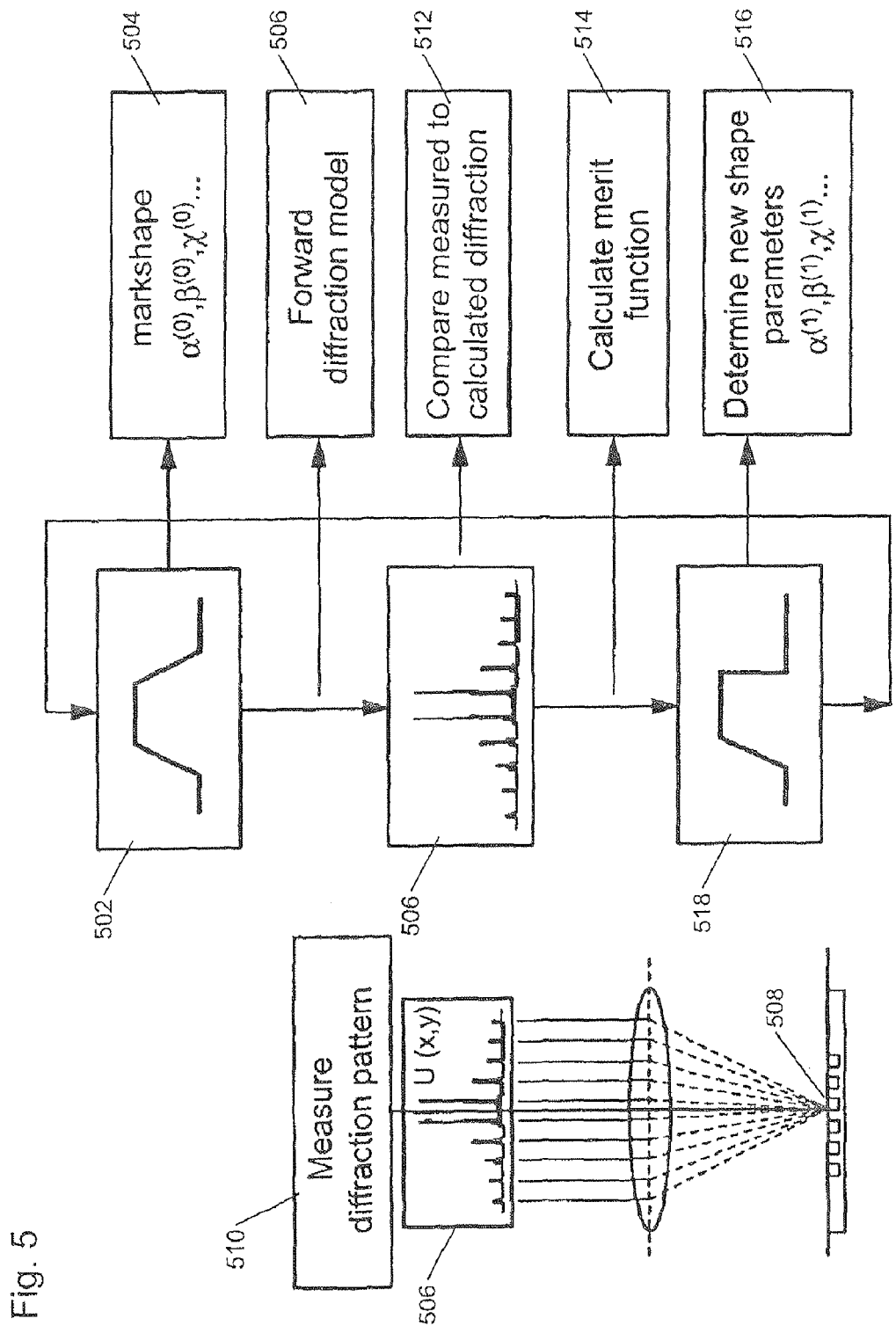

METHOD, INSPECTION APPARATUS AND SUBSTRATE FOR DETERMINING AN APPROXIMATE STRUCTURE OF AN OBJECT ON A SUBSTRATE

CROSS REFERENCE TO RELATED APPLICATIONS

This application claims priority under 35 U.S.C. §119(e) to U.S. Provisional Patent Application No. 61/250,834, filed Oct. 12, 2009, which is incorporated by reference herein in its entirety.

BACKGROUND

1. Field of the Invention

The present invention relates to determining an approximate structure of an object on a substrate. The invention may be applied for example in model based metrology of microscopic structures, for example to assess critical dimensions (CD) or overlay performance of a lithographic apparatus.

2. Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it or critical dimensions of layers formed on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

By comparing the properties of the beam before and after it has been reflected or scattered by the substrate, the properties of the substrate can be determined. This can be done, for example, by comparing data obtained from measurement of the reflected or scattered beam with data stored in a library of known measurements associated with known substrate properties. Scatterometry, may also be based upon fitting a calculated signal from a parameterized model to measured optical signals such as diffraction signals.

The aim is to collect sufficient independent optical measurement signals to enable determination of the parameters with sufficient accuracy. In particular for complex patterns, the number of parameters required to describe a profile is high, asking for more optical measurement signals.

SUMMARY

According to a first aspect of the invention, there is provided a method of determining an approximate structure of an object on a substrate. The substrate comprises an upper layer and an underlying layer, the substrate comprising a first region, the first region comprising the object, the object comprising a patterned portion of the upper layer and a portion of the underlying layer, and the substrate further comprising a second region where the upper layer is absent, the second region comprising a portion of the underlying layer. The method comprising the following steps. Detecting a diffraction signal arising from illumination of the first region by a radiation beam. Detecting an electromagnetic scattering property arising from illumination of the second region by a radiation beam. Determining an approximate structure of the object based on the detected diffraction signal and the detected electromagnetic scattering property.

According to a second aspect of the invention, there is provided an inspection apparatus for determining an approximate structure of an object on a substrate. The substrate comprises an upper layer and an underlying layer. The substrate comprises a first region, the first region comprising the object, the object comprising a patterned portion of the upper layer and a portion of the underlying layer, and the substrate further comprising a second region where the upper layer is absent, the second region comprising a portion of the underlying layer. The inspection apparatus comprises an illumination system, a detection system, and a processor. The illumination system is configured to illuminate the first and second regions with radiation. The detection system is configured to detect a diffraction signal arising from the illumination of the first region and to detect an electromagnetic scattering property arising from the illumination of the second region. The processor is configured to determine an approximate structure of the object based on the detected diffraction signal and the detected electromagnetic scattering property.

According to a third aspect of the invention, there is provided a computer program product containing one or more sequences of machine-readable instructions for determining an approximate structure of an object on a substrate, the instructions being adapted to cause one or more processors to perform a method of determining an approximate structure of an object on a substrate. The substrate comprising an upper layer and an underlying layer. The substrate comprising a first region, the first region comprising the object, the object comprising a patterned portion of the upper layer and a portion of the underlying layer, and the substrate further comprising a second region where the upper layer is absent, the second region comprising a portion of the underlying layer. The method comprising the following steps. Receiving a diffraction signal arising from illumination of the first region by a radiation beam. Receiving an electromagnetic scattering property arising from illumination of the second region by a radiation beam. Determining an approximate structure of the object based on the received diffraction signal and the received electromagnetic scattering property.

According to a fourth aspect of the invention, there is provided a substrate for determining an approximate structure of an object on the substrate. The substrate comprises an upper layer and an underlying layer. The substrate comprises a first scatterometry target, the first scatterometry target comprising the object, the object comprising a patterned portion of the upper layer and a portion of the underlying layer, and the substrate further comprises a second scatterometry target, the upper layer being absent from the second scatterometry target and the second scatterometry target comprising a portion of the underlying layer.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 3 depicts a first scatterometer.

FIG. 4 depicts a second scatterometer.

FIG. 5 depicts a generic process for reconstruction of a 1-dimensional periodic diffraction grating from scatterometer measurements.

Figure 1:
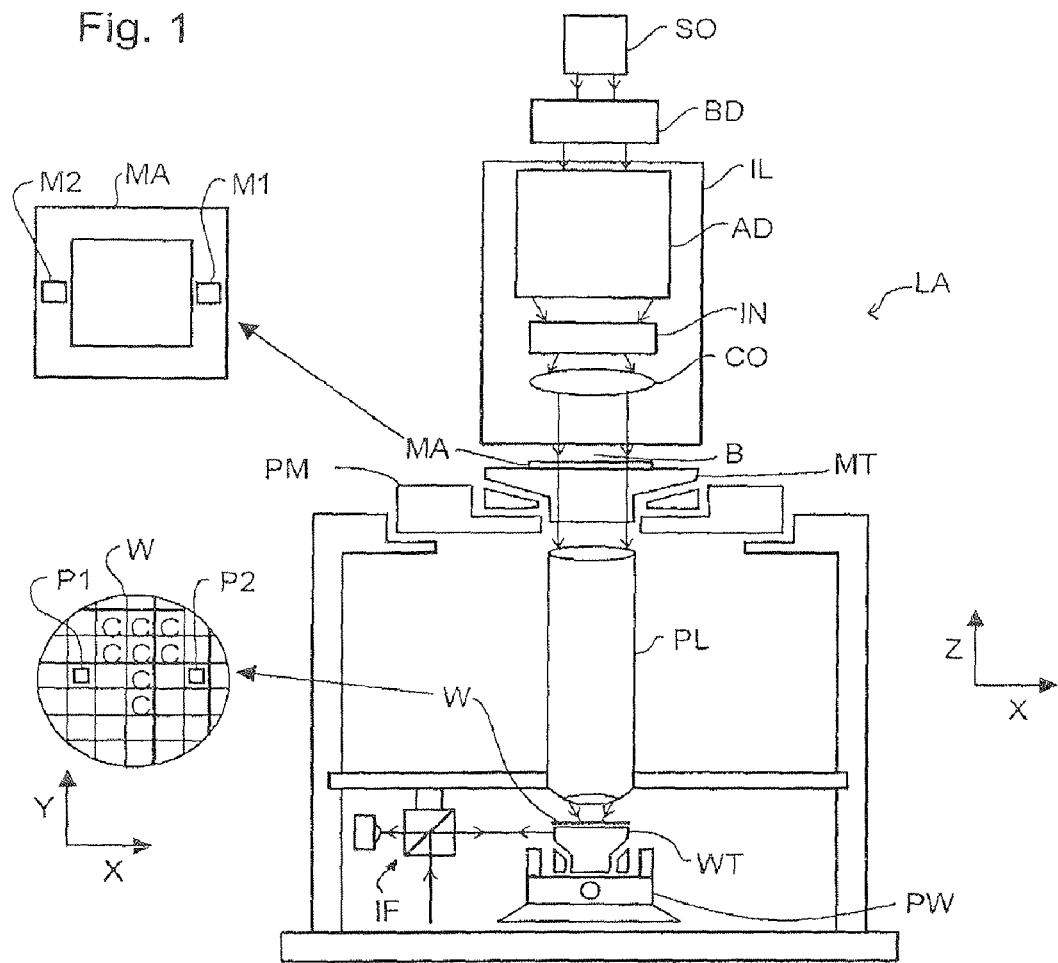
FIG. 1 depicts a lithographic apparatus.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus. The apparatus comprises an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is-reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable minor array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

U.S. Pat. No. 7,522,293, which is incorporated by reference herein in its entirety, describes a method for optical metrology for multiple patterned layers, including obtaining a first measured diffraction signal measured from a first patterned layer before a second patterned layer is formed on top of the first patterned layer. The method proposed in that patent requires that each wafer passes the metrology tool twice. The measurement results of the first pass must be stored during the formation of the second patterned layer. This has an impact on logistics and data management. The results of the first measurement must be available to the measurement tool upon the second measurement, preferably independent of the actual measurement tool in a fleet of equivalent measurement tools. Furthermore, calibration of the measurement tool may drift in between measurements.

Figure 2:
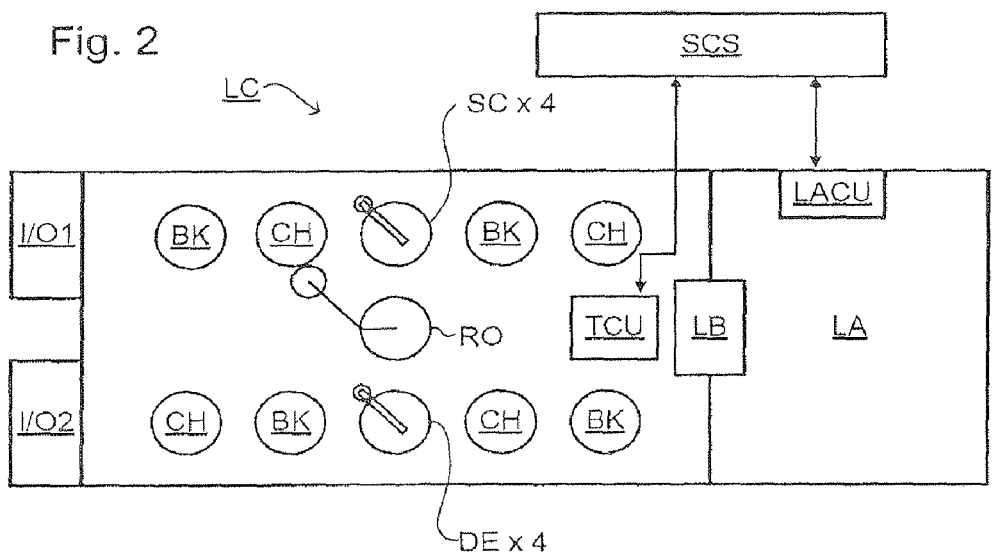
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded, thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

FIG. 3 depicts a scatterometer which may be used in an embodiment of the present invention. It comprises a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g., conventionally by Rigorous Coupled Wave Analysis (RCWA) and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Another scatterometer that may be used in an embodiment of the present invention is shown in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths—and therefore of colors) is possible, which gives a large etendue, allowing the mixing of multiple wavelengths. The plurality of wavelengths in the broadband preferably each has a bandwidth of $\Delta\lambda$ and a spacing of at least 2 $\Delta\lambda$ (i.e., twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A, which is incorporated by reference herein in its entirety.

The target 30 on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

As described above, the target is on the surface of the substrate. This target will often take the shape of a series of lines in a grating or substantially rectangular structures in a 2-D array. The purpose of rigorous optical diffraction theories in metrology is effectively the calculation of a diffraction spectrum that is reflected from the target. In other words, target shape information is obtained for CD (critical dimension) uniformity and overlay metrology. Overlay metrology is a measuring system in which the overlay of two targets is measured in order to determine whether two layers on a substrate or aligned or not. CD uniformity is simply a measurement of the uniformity of the grating on the spectrum to determine how the exposure system of the lithographic apparatus is functioning. Specifically, CD, or critical dimension, is the width (e.g., the width of the target shown in FIG. 5) of the object that is "written" on the substrate and is the limit at which a lithographic apparatus is physically able to write on a substrate.

The way the measurement of the target shape and/or material properties (also referred to as the markshape) is typically carried out for 1D-periodic structures is as follows, with reference to FIG. 5:

1. The target shape 502 is estimated 504. This estimated shape is given different parameters such as $\alpha^{(0)}$, $\beta^{(0)}$, $\chi^{(0)}$, and so on. Each of these parameters may be, for example, the angle of each side wall, the height of the top of the target, the width at the top of the target, the width at the bottom of the target, etc.

2. Typically, a rigorous optical diffraction method such as RCWA is used to calculate 506 the scattering properties, such as an estimated or model diffraction pattern of the estimated target shape. Other electromagnetic scattering properties such as estimated or model reflection or transmission coefficients may be used in place of or to obtain the estimated or model diffraction pattern.

3. The diffraction pattern 506 of the actual target 508 on the substrate is then measured 510 by illuminating the target on the substrate with a radiation beam and detecting the diffracted beam, the pattern of which will be dependent on the properties of the target. This measured diffraction pattern and the model diffraction pattern are forwarded to a calculation system such as a computer.

4. The measured diffraction pattern and the model diffraction pattern are then compared 512 and any differences are fed into a "merit function" calculation 514.

5. Using the merit function, which relates the sensitivity of certain target parameters to the shape of the diffraction pattern, new shape parameters are estimated 516. This may give a shape that is closer to the bottom shape 518 of FIG. 5 which has new parameters such as $\alpha^{(1)}$, $\beta^{(1)}$, $\chi^{(1)}$, etc. These may be fed back iteratively into step 1 and steps 1 to 5 iterated until the desired accuracy is attained, thereby determining an approximate object structure.

The computation time of this iterative process is largely determined by the forward diffraction model, i.e., the calculation of the estimated model diffraction pattern using a rigorous optical diffraction theory from the estimated target shape. If more parameters are required, then more calculation time is required.

A plurality of model diffraction patterns for different estimated target shapes may be calculated and stored in a library in step 2. Then in step 4 the measured diffraction pattern is compared to the model diffraction patterns in the library generated in step 2. If a match is found then the estimated target shape used to generate the matching library pattern can be determined to be the approximate object structure. Therefore iteration may not be needed if a library is used and a match is found. Alternatively a library search may be used to determine a course set of shape parameters, followed by one or more iteration using the merit function to determine a more accurate set of shape parameters so as to determine the approximate object structure.

Figure 6:
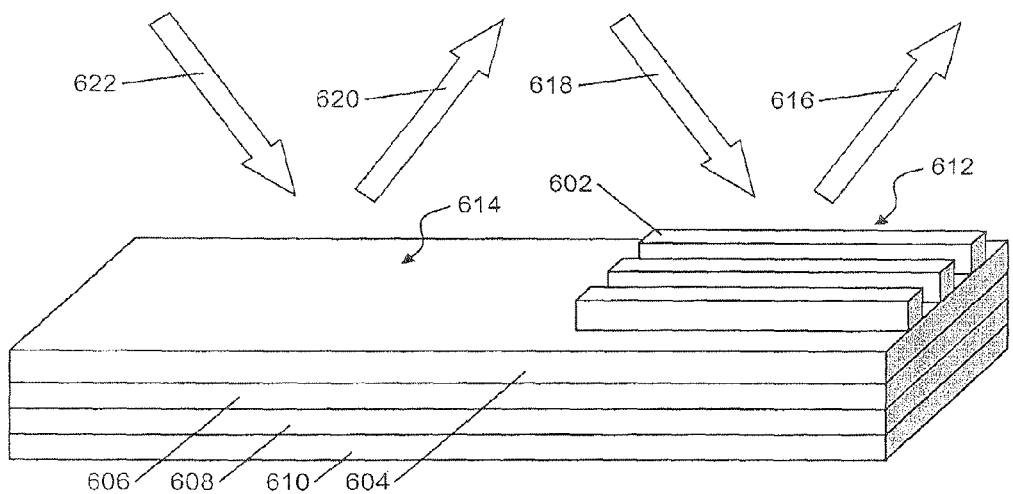
FIG. 6 illustrates measurements being performed to determine an approximate structure of a grating on a stack in accordance with an embodiment of the present invention.

FIG. 6 illustrates measurements being performed to determine an approximate structure of an object, in this example a grating on a stack, on a wafer substrate in accordance with an embodiment of the present invention.

The wafer substrate has an upper layer 602 and an underlying layer 604. The underlying layer may be made up of several layers 604 to 610. Although the upper layer is shown in FIG. 6 as having one layer 602, it may be made up of more than one layer. The substrate has a first scatterometry target region 612, comprising the grating on a stack. The grating on a stack is made up of the upper 602 and underlying layers 606-610. The upper layer 602 is patterned with the periodic grating. The substrate further has a neighboring second scatterometry target region 614, where the upper layer is absent. By having the regions near to each other relative to the diameter of the wafer, then cross wafer variation of structure and material parameters is minimized. It is also quicker to move between the regions when they are near or adjacent. The second region 614 has just the unpatterned underlying layers 606-610.

The structure of the grating on a stack is determined by detecting a diffraction signal by measurement of the diffracted radiation 616 arising from illumination of the first region 614 by a radiation beam 618 and determining an approximate structure of the grating on a stack, based on the detected diffraction signal from the diffracted radiation 616 and also using a detected electromagnetic scattering property, here a zeroth order reflection signal, obtained by measuring the reflected light 620 arising from illumination of the second region 614 by a radiation beam 622. Radiation beams 618 and 622 may be the same radiation beam and/or originating from the same scatterometer. The step of determining an approximate structure of the grating on a stack involves using the detected zeroth order reflection signal to determine an approximate structure of the underlying layer.

The measurements at the first and second regions 612 and 614 may be done in any order. An advantage of measuring the second region 614 first is that reconstruction an approximate structure of the underlying layers may begin as soon as the zeroth order reflection signal has been detected and for example while the wafer stage is moving the substrate from the second 614 to the first region 612. This means that if the underlying layer reconstruction is fast enough then the reconstruction of the grating on a stack can have the underlying layer model fed directly into it as soon as the detection of the diffraction signal by measurement of the diffracted radiation 616 is complete.

The illumination of the first and second regions 612 and 614 and the corresponding detection is performed after both the upper 602 and underlying layers 604-610 are formed.

Figure 7:
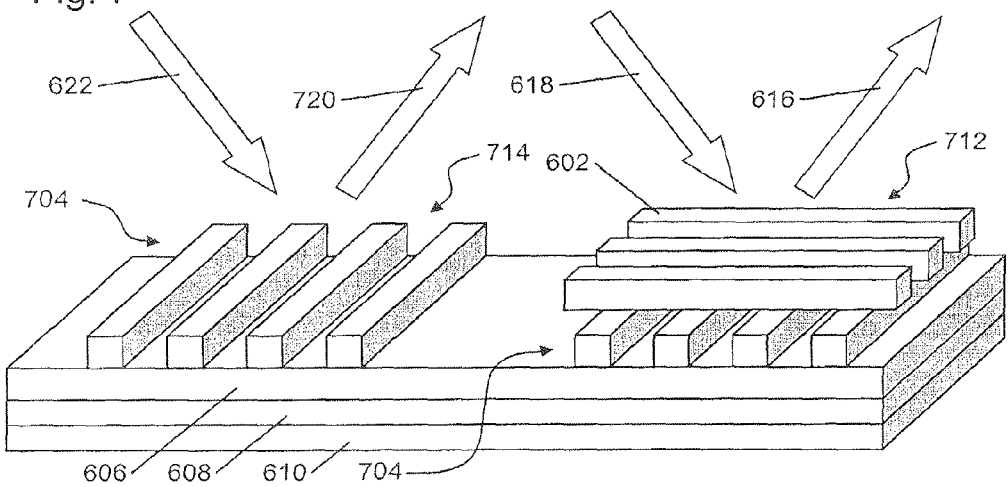
FIG. 7 illustrates measurements being performed to determine an approximate structure of a crossed grating on a stack in accordance with an embodiment of the present invention.

The step of determining the approximate structure of the grating on a stack in region 612 of FIG. 7 may be performed in accordance with the method of FIG. 5, where the diffraction signal from the measurement of diffracted radiation 616 corresponds to the measured diffraction pattern 506 and the step 504 of estimating the target shape, i.e., the structure of the grating on a stack, is based on the detected zeroth order reflection signal from the second region 614.

This estimation step 504 may be done by determining an approximate structure of the underlying layers 604-610 in a similar way to the method of FIG. 5, but where the zeroth order reflection signal detected by measurement of reflected radiation 620 from the second region 614 is used instead of the measured diffraction pattern 506 of FIG. 5.

This method of determining an approximate structure of the underlying layers 604-610 is performed as follows, with references made to the corresponding items in FIG. 5.

1. The underlying layer structure is estimated 504. This estimated structure is given different parameters such as $\alpha^{(0)}$, $\beta^{(0)}$, $\chi^{(0)}$, and so on. Each of these parameters may be, for example, the thickness of a layer, the material properties of a layer, etc.

2. Typically, a rigorous optical diffraction method such as RCWA is used to calculate the scattering or reflection properties, such as an estimated or model zeroth order reflection signal of the estimated underlying layer structure. Other electromagnetic scattering properties such as estimated or model reflection or transmission coefficients may be used in place of or to obtain the estimated or zeroth order reflection signal.

3. The zeroth order reflection signal of the actual underlying layer structure on the substrate is then measured by illuminating the target second region 614 on the substrate with a radiation beam 622 and detecting the reflected zeroth order beam 620 to obtain a zeroth order reflection signal, the characteristics of which will be dependent on the properties of the underlying layer structure. This measured zeroth order reflection signal and the model zeroth order reflection signal are forwarded to a calculation system such as a computer.

4. The measured zeroth order reflection signal and the model zeroth order reflection signal are then compared 512 and any differences are fed into a "merit function" calculation 514.

5. Using the merit function, which relates the sensitivity of certain target parameters to the zeroth order reflection signal, new underlying layer structure parameters are estimated 516. This may give an underlying layer structure that has new parameters such as $\alpha^{(1)}$, $\beta^{(1)}$, $\chi^{(1)}$, etc. These may be fed back iteratively into step 1 and steps 1 to 5 iterated until the desired accuracy is attained, thereby determining an approximate underlying layer structure.

FIG. 7 illustrates measurements being performed to determine an approximate structure of an object, in this example a crossed grating on a stack, on a wafer substrate in accordance with an embodiment of the present invention. The items that are the same as in FIG. 6 are labeled with numerals the same as in FIG. 6. The difference in FIG. 7 is that the underlying layer 704 is patterned in both scatterometry target regions 712 and 714 with the same pattern, in this example a periodic grating. Because of the pattern in the underlying layer 704, the radiation beam 622 is diffracted. Therefore the detected electromagnetic scattering property obtained by measuring the diffracted radiation 720 is a diffraction signal or diffraction pattern.

The step of determining the approximate structure of the crossed grating on a stack in region 712 of FIG. 7 may be performed in accordance with the method of FIG. 5, where the diffraction signal from the measurement of diffracted radiation 616 from the first region 712 corresponds to the measured diffraction pattern 506 in step 3 and the step 504 of estimating the target shape, i.e., the structure of the crossed grating on a stack, is based on the detected diffraction pattern from the second region 714.

This estimation step 504 may be done by determining an approximate structure of the underlying layers 704, 606-610 again in accordance with the method of FIG. 5, but where the diffraction pattern from the detection of diffracted radiation 720 from the second region 714 corresponds to the measured diffraction pattern 506 of FIG. 5.

Although 1-dimensional periodic gratings are used in the examples shown in FIGS. 6 and 7, other scatterometry target structures, for example with 2-dimensional periodicity may be used.

Figure 8:
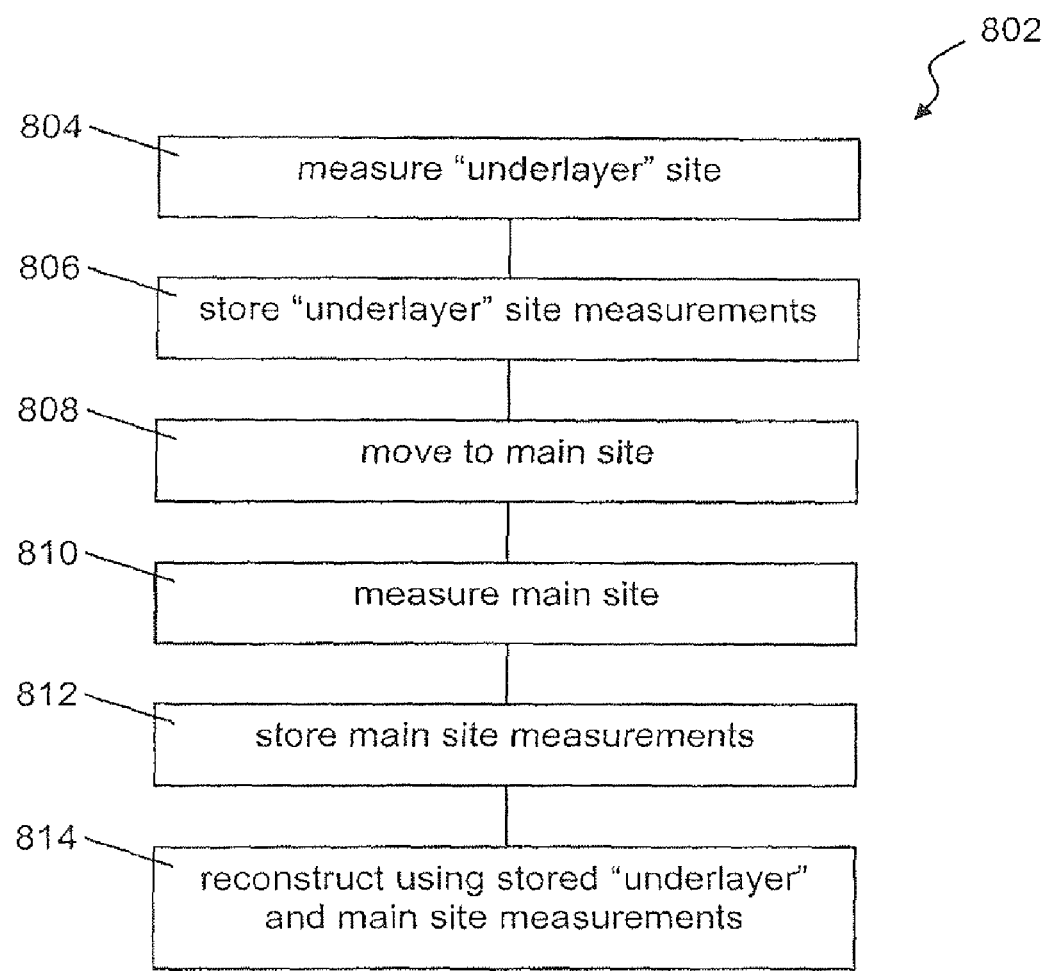
FIG. 8 is a flowchart illustrating a method of determining an approximate structure of an object on a wafer in accordance with an embodiment of the present invention.

FIG. 8 is a flowchart 802 illustrating a method of determining an approximate structure of an object on a wafer in accordance with an embodiment of the present invention. After measuring 804 the underlayer site (e.g., 614 in FIG. 6 or 714 in FIG. 7) and storing 806 the results. The wafer table is moved 808 to align the scatterometer to the main site. The main site is measured 810 and the results stored 812. Finally, the main site structure (e.g., the grating on a stack in region 612 of FIG. 6 or the crossed grating on a stack in region 712 of FIG. 7) is reconstructed using the stored underlayer and main site measurements.

Figure 9:
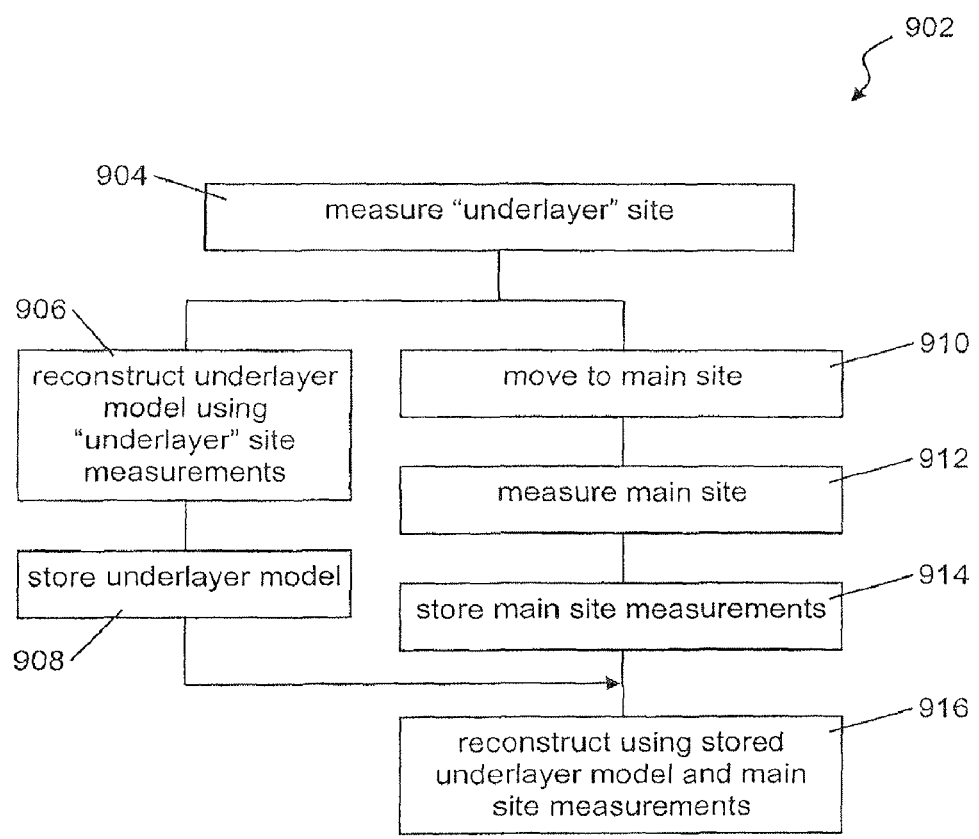
FIG. 9 is a flowchart illustrating a method of determining an approximate structure of an object on a wafer in accordance with an embodiment of the present invention in which reconstruction of an underlying layer is performed in parallel with the measurement of the object.

FIG. 9 is a flowchart 902 illustrating a method of determining an approximate structure of an object on a wafer in accordance with an embodiment of the present invention. In contrast to the method described with reference to FIG. 8, the reconstruction of the underlying layer is performed in parallel with the measurement of the main site. After measuring 904 the underlayer site, the reconstruction 906 of the underlayer is performed using the underlayer site measurements. The resulting underlayer model is stored 908. Meanwhile, the wafer table is moved 910 to align the scatterometer to the main site. The main site is measured 912 and the results stored 914. Finally, the main site structure (e.g., the grating on a stack in region 612 of FIG. 6 or the crossed grating on a stack of in region 712 of FIG. 7) is reconstructed using the stored underlayer model and main site measurements.

Embodiments of the present invention measure the characteristic parameters of the underlying unpatterned or patterned layer on a different site, similar to and not far from the site where an upper patterned layer on top of the underlying layer is to be measured.

An advantage of the present invention is that only one metrology pass is needed. Data from the underlying layer need not to be stored for a longer period, and will be automatically available during the second measurement. Both measurements may be performed on the same tool, in the same calibration status, thereby reducing errors.

The processing unit PU described above with reference to FIGS. 3 and 4 may be configured to reconstruct an approximate structure of an object using the methods described herein.

The processing unit PU may operated with a computer program product containing one or more sequences of machine-readable instructions for determining an approximate structure of an object on a substrate, the instructions being adapted to cause one or more processors in the PU to perform the methods described herein. In such an arrangement, a software module running on the processing unit PU may receive the diffraction signal and the electromagnetic scattering property from the other components of the scatterometer.

Although specific reference may be made in this text to the use of inspection methods and apparatus in the manufacture of ICs, it should be understood that the inspection methods and apparatus described herein may have other applications, such as the manufacture of integrated optical systems, guidance and detection patterns for magnetic domain memories, flat-panel displays, reticles, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The term "electromagnetic" encompasses electric and magnetic.

The term "electromagnetic scattering properties" encompasses reflection and transmission coefficients and scatterometry measurement parameters including spectra (such as intensity as a function of wavelength), diffraction patterns (intensity as a function of position/angle) and the relative intensity of transverse magnetic- and transverse electric-polarized light and/or the phase difference between the transverse magnetic- and transverse electric-polarized light. Diffraction patterns themselves may be calculated for example using reflection coefficients.

Thus, although embodiments of the present invention are described in relation to reflective scattering, the invention is also applicable to transmissive scattering.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of determining an approximate structure of an object on a substrate, the method comprising:

detecting a diffraction signal arising from illumination of a first region by a radiation beam;

detecting an electromagnetic scattering property arising from illumination of a second region by another radiation beam; and determining an approximate structure of the object based on the detected diffraction signal and the detected electromagnetic scattering property, wherein the determining comprises:

estimating at least one estimated object structure based on the detected electromagnetic scattering property, determining at least one model diffraction signal from the at least one estimated object structure, comparing the detected diffraction signal to the at least one model diffraction signal, and determining the structure of the object based on the result of the comparison of the detected diffraction signal to the at least one model diffraction signal, wherein the substrate comprises an upper layer and an underlying layer, the substrate comprises the first region, the first region comprising the object, the object comprising a patterned portion of the upper layer and a first portion of the underlying layer, and the substrate further comprising the second region where the upper layer is absent, the second region comprising a second portion of the underlying layer.

2. The method of claim 1, wherein the determining an approximate structure of the object comprises using the detected electromagnetic scattering property to determine an approximate structure of the underlying layer.

3. The method of claim 1, wherein the first and second portions of the underlying layer are unpatterned in the first and second regions and the detected electromagnetic scattering property comprises a zeroth order reflection signal.

4. The method of claim 1, wherein the first and second portions of the underlying layer are patterned in the first and second regions and the detected electromagnetic scattering property comprises a diffraction signal.

5. The method of claim 1, wherein the first region neighbors the second region.

6. The method of claim 1, wherein the illumination of the first and second regions and the corresponding detection is performed after both the upper and underlying layers are formed.

7. The method of claim 1, further comprising:
arranging a plurality of model diffraction signals in a first library; and
wherein the comparing the detected diffraction signal to the at least one model diffraction signal comprises matching the detected diffraction signal to contents of the first library.

8. The method of claim 1, further comprising:
iterating the estimating at least one estimated object structure, the determining at least one model diffraction signal, and the comparing the detected diffraction signal,
wherein the estimating at least one estimated object structure is based on the result of a previous iteration of the comparing the detected diffraction signal.

9. The method of claim 1, wherein the estimating at least one estimated object structure comprises determining an approximate structure of the underlying layer by:
estimating at least one estimated underlying layer structure;
determining at least one model electromagnetic scattering property from the at least one estimated underlying layer structure;
comparing the detected electromagnetic scattering property to the at least one model electromagnetic scattering property; and
determining the approximate structure of the underlying layer based on the result of the comparison of the detected electromagnetic scattering property to the at least one model electromagnetic scattering property.

10. The method of claim 9, further comprising:
arranging a plurality of the model diffraction electromagnetic scattering properties in a second library,
wherein the comparing the detected electromagnetic scattering property to the at least one model electromagnetic scattering property comprises matching the detected electromagnetic scattering property signal to contents of the second library.

11. The method of claim 9, further comprising:
iterating the estimating at least one estimated underlying layer structure, the determining at least one model electromagnetic scattering property, and the comparing the detected electromagnetic scattering property, wherein the estimating at least one estimated underlying layer structure is based on the result of a previous iteration of the comparing the detected electromagnetic scattering property.

12. An inspection apparatus for determining an approximate structure of an object on a substrate, the inspection apparatus comprising:
an illumination system configured to illuminate first and second regions with radiation;
a detection system configured to detect a diffraction signal arising from the illumination of the first region and to detect an electromagnetic scattering property arising from the illumination of the second region; and
a processor configured to determine an approximate structure of the object based on the detected diffraction signal and the detected electromagnetic scattering property, wherein the determining comprises:
estimating at least one estimated object structure based on the detected electromagnetic scattering property,
determining at least one model diffraction signal from the at least one estimated object structure,
comparing the detected diffraction signal to the at least one model diffraction signal, and
determining the approximate structure of the object based on the result of the comparison of the detected diffraction signal to the least one model diffraction signal,
wherein the substrate comprises an upper layer and an underlying layer, the substrate comprises the first region, the first region comprising object, the object comprising a patterned portion of the upper layer and a first portion of the underlying layer, and the substrate further comprising the second region where the upper layer is absent, the second region comprising a second portion of the underlying layer.

13. An article of manufacture including a computer-readable medium having instructions stored thereon execution of which by a computing device, cause the computing device to perform operations for determining an approximate structure of an object on a substrate, the operations comprising:
receiving a diffraction signal arising from illumination of a first region;
receiving an electromagnetic scattering property arising from illumination of a second region; and determining an approximate structure of the object based on the received diffraction signal and the received electromagnetic scattering property, wherein the determining comprises:
estimating, at least one estimated object structure based on the detected electromagnetic scattering property,
determining at least one model diffraction signal from the at least one estimated object structure,
comparing the detected diffraction signal to the at least one model diffraction signal, and
determining the approximate structure of the object based on the result of the comparison of the detected diffraction signal to the at least one model diffraction signal,
wherein the substrate comprises an upper layer and an underlying layer, the substrate comprises the first region, the first region comprising the object, the object comprising a patterned portion of the upper layer and a first portion of the underlying layer, and the substrate further comprising the second region where the upper layer is absent, the second region comprising a second portion of the underlying layer.

* * * * *

UNITED STATES PATENT AND TRADEMARK OFFICE
CERTIFICATE OF CORRECTION

| | | |
|---|---|---|
| PATENT NO. | : 8,390,823 B2 | Page 1 of 1 |
| APPLICATION NO. | : 12/884107 | |
| DATED | : March 5, 2013 | |
| INVENTOR(S) | : Cramer et al. | |

It is certified that error appears in the above-identified patent and that said Letters Patent is hereby corrected as shown below:

Title Page, Item (56), Reference Cited section, under "FOREIGN PATENT DOCUMENTS" please delete "1 628 184 A1" and insert -- 1 628 164 A1 --

In the Claims:

In column 15, claim 7, line 48, please delete "; and" and insert -- , --

Signed and Sealed this
Seventh Day of May, 2013

Teresa Stanek Rea
*Acting Director of the United States Patent and Trademark Office*